US008536780B2

(12) United States Patent
Wakimoto

(10) Patent No.: US 8,536,780 B2
(45) Date of Patent: Sep. 17, 2013

(54) LIGHTING DEVICE AND ATTACHMENT BOARD OF LIGHTING DEVICE

(75) Inventor: Kenichi Wakimoto, Hokkai-do (JP)

(73) Assignee: Semiconductor Energy Laboratory Co., Ltd. (JP)

(*) Notice: Subject to any disclaimer, the term of this patent is extended or adjusted under 35 U.S.C. 154(b) by 61 days.

(21) Appl. No.: 13/354,907

(22) Filed: Jan. 20, 2012

(65) Prior Publication Data

US 2012/0187825 A1 Jul. 26, 2012

(30) Foreign Application Priority Data

Jan. 24, 2011 (JP) ................................ 2011-012067

(51) Int. Cl.
*H01J 45/00* (2006.01)
*H01L 23/04* (2006.01)

(52) U.S. Cl.
USPC ............ 313/504; 313/503; 313/507; 257/88; 257/98

(58) Field of Classification Search
CPC .................... H01L 2224/45124; G02B 6/421; H01J 45/00
USPC ....................... 257/88, 89, 98; 362/95, 202; 313/498–507; 445/24–25
See application file for complete search history.

(56) References Cited

U.S. PATENT DOCUMENTS

| | | | | |
|---|---|---|---|---|
| 6,787,990 | B2 | 9/2004 | Cok | |
| 7,717,585 | B2 | 5/2010 | Bole | |
| 7,999,463 | B2 | 8/2011 | Nomura | |
| 2009/0168439 | A1 * | 7/2009 | Chiang | 362/404 |
| 2011/0089814 | A1 | 4/2011 | Nomura | |
| 2011/0089823 | A1 | 4/2011 | Nomura | |
| 2011/0101388 | A1 | 5/2011 | Nomura | |
| 2011/0140617 | A1 | 6/2011 | Nomura | |

FOREIGN PATENT DOCUMENTS

| | | |
|---|---|---|
| JP | 2006-108651 | 4/2006 |

* cited by examiner

*Primary Examiner* — Tracie Y Green
(74) *Attorney, Agent, or Firm* — Husch Blackwell LLP

(57) ABSTRACT

A lighting device whose attachment position can be easily changed and an attachment board of the lighting device are provided. The lighting device employs a structure in which an attachment terminal included in a housing to which a light-weight planar light-emitting element is fixed is inserted into the attachment board, so as to fix the housing, and power is supplied from two wirings, which have different polarities and are provided inside the attachment board, to the light-emitting element through the attachment terminal.

37 Claims, 5 Drawing Sheets

LIGHTING DEVICE AND ATTACHMENT BOARD OF LIGHTING DEVICE

BACKGROUND OF THE INVENTION

1. Field of the Invention

The present invention relates to a lighting device and an attachment board of the lighting device.

2. Description of the Related Art

An organic EL element has a structure in which a layer containing a light-emitting organic compound (also referred to as an EL layer) is sandwiched between a pair of electrodes. By applying voltage between the pair of electrodes of this element, light emission from the light-emitting organic compound can be obtained.

The organic EL element can be formed into a film; thus, a large-area element can be easily formed. Therefore, the organic EL element has a high utility value as a surface light source that can be applied to lighting or the like.

For example, a lighting device including an organic EL element is disclosed in Patent Document 1.

REFERENCE

Patent Document

[Patent Document 1] Japanese Published Patent Application No. 2006-108651

SUMMARY OF THE INVENTION

In the case of mounting a lighting device on a structure of a building, such as a ceiling, it is necessary to provide a support for supporting the weight of the lighting device. Further, in order to supply power from a lamp line to the lighting device without impairing the appearance, the lighting device needs to be connected to a wiring through an opening provided in the structure of the building, such as a ceiling. Accordingly, there is a problem such that once mounted, the position of the lighting device cannot be easily changed.

The present invention is made in view of the foregoing technical background. Therefore, an object of one embodiment of the present invention is to provide a lighting device whose attachment position can be easily changed and an attachment board of the lighting device.

In order to achieve the above object, the present invention focuses on a lightweight planar light-emitting element. The present inventor conceived a structure of a lighting device, in which an attachment terminal included in a housing to which a lightweight planar light-emitting element is fixed is inserted into an attachment board, so as to fix the housing, and power is supplied from a wiring provided inside the attachment board to the light-emitting element through the attachment terminal, thereby achieving the above object.

In other words, one embodiment of the present invention is a lighting device, which includes a light-emitting element including a layer containing a light-emitting organic compound between a first electrode which is spread out in a plane and a second electrode which is spread out in a plane, and a housing including on one side a first attachment terminal electrically connected to the first electrode and a second attachment terminal electrically connected to the second electrode at a distance from each other. One of the first electrode and the second electrode transmits light emitted from the light-emitting organic compound. The other of the first electrode and the second electrode is positioned on the other side of the housing. The first attachment terminal and the second attachment terminal each have a surface area greater than or equal to 0.5 times and less than or equal to 6 times as large as a cross-sectional area.

Another embodiment of the present invention is an attachment board of the lighting device, including a first wiring and a second wiring provided at the distance from each other between a first member which is spread out in a plane and a second member which is spread out in a plane. The first wiring and the second wiring have different polarities. The first wiring has a larger width than the first attachment terminal, and the second wiring has a larger width than the second attachment terminal. The first member has a thickness smaller than each of the length of the first attachment terminal and the length of the second attachment terminal and can be penetrated by the first attachment terminal and the second attachment terminal.

According to one embodiment of the present invention, an attachment terminal included in a housing to which a lightweight planar light-emitting element is fixed is inserted into an attachment board so as to fix the housing, and power can be supplied from a wiring provided inside the attachment board to the light-emitting element through the attachment terminal. With such a structure, a lighting device whose attachment position can be easily changed and an attachment board of the lighting device can be provided without subjecting the attachment board to processing which impairs the appearance.

Another embodiment of the present invention is a lighting device, which includes a light-emitting element including a layer containing a light-emitting organic compound between a first electrode which is spread out in a plane and a second electrode which is spread out in a plane, and a housing including on one side a first attachment terminal electrically connected to the first electrode and a second attachment terminal electrically connected to the second electrode. One of the first electrode and the second electrode transmits light emitted from the light-emitting organic compound. The other of the first electrode and the second electrode is positioned on the other side of the housing. The first attachment terminal and the second attachment terminal each have a surface area greater than or equal to 0.5 times and less than or equal to 6 times as large as a cross-sectional area. One of the first attachment terminal and the second attachment terminal is longer than the other and includes a contact at a portion farther from the housing than a portion of a contact of the other.

Another embodiment of the present invention is an attachment board of the lighting device, including a first wiring which is spread out in a plane and provided between a first member which is spread out in a plane and a second member which is spread out in a plane, and a second wiring which is spread out in a plane, is provided on a surface of the second member on the side opposite to the side facing the first member, and has a different polarity from the first, wiring. The first member has a thickness smaller than each of the length of the first attachment terminal and the length of the second attachment terminal. The thickness of a stack of the first member, the first wiring, and the second member is larger than the length of one of the first attachment terminal and the second attachment terminal and smaller than the length of the other. The first member can be penetrated by each of the first attachment terminal and the second attachment terminal. The second member can be penetrated by one of the first attachment terminal and the second attachment terminal which is longer than the other.

Another embodiment of the present invention is a lighting device, which includes a light-emitting element including a layer containing a light-emitting organic compound between a first electrode which is spread out in a plane and a second electrode which is spread out in a plane, and a housing including on one side an attachment terminal. One of the first electrode and the second electrode transmits light emitted from the light-emitting organic compound. The other of the first electrode and the second electrode is positioned on the other side of the housing. The attachment terminal includes on the end side a first contact electrically connected to the first electrode and includes on the housing side a second contact electrically connected to the second electrode. The attachment terminal has a surface area greater than or equal to 0.5 times and less than or equal to 6 times as large as a cross-sectional area.

Another embodiment of the present invention is an attachment board of the lighting device, including a first wiring which is spread out in a plane and provided between a first member which is spread out in a plane and a second member which is spread out in a plane, and a second wiring which is spread out in a plane, is provided on a surface of the second member on the side opposite to the side facing the first member, and has a different polarity from the first wiring. The first member has a thickness smaller than each of the length from the housing to the first contact of the attachment terminal and the length from the housing to the second contact of the attachment terminal. The thickness of a stack of the first member, the first wiring, and the second member is larger than the length from the housing to the second contact of the attachment terminal and smaller than the length from the housing to the first contact of the attachment terminal. The first member and the second member can be penetrated by the attachment terminal.

According to one embodiment of the present invention, a lightweight planar light-emitting element is fixed to a housing provided with an attachment terminal, the attachment terminal is inserted into an attachment board provided with a wiring, so as to fix the housing, and power can be supplied from the wiring included in the attachment board to a lighting device through the attachment terminal. With such a structure, a lighting device whose attachment position can be easily changed to a position desired by a user and an attachment board of the lighting device can be provided, without subjecting the attachment board to processing which impairs the appearance.

Note that in this specification, an "EL layer" refers to a layer provided between a pair of electrodes in a light-emitting element. Thus, a light-emitting layer containing an organic compound that is a light-emitting substance which is interposed between electrodes is an embodiment of the EL layer.

According to the present invention, a lighting device whose attachment position can be easily changed and an attachment board of the lighting device can be provided.

DETAILED DESCRIPTION OF THE INVENTION

Figure 1:
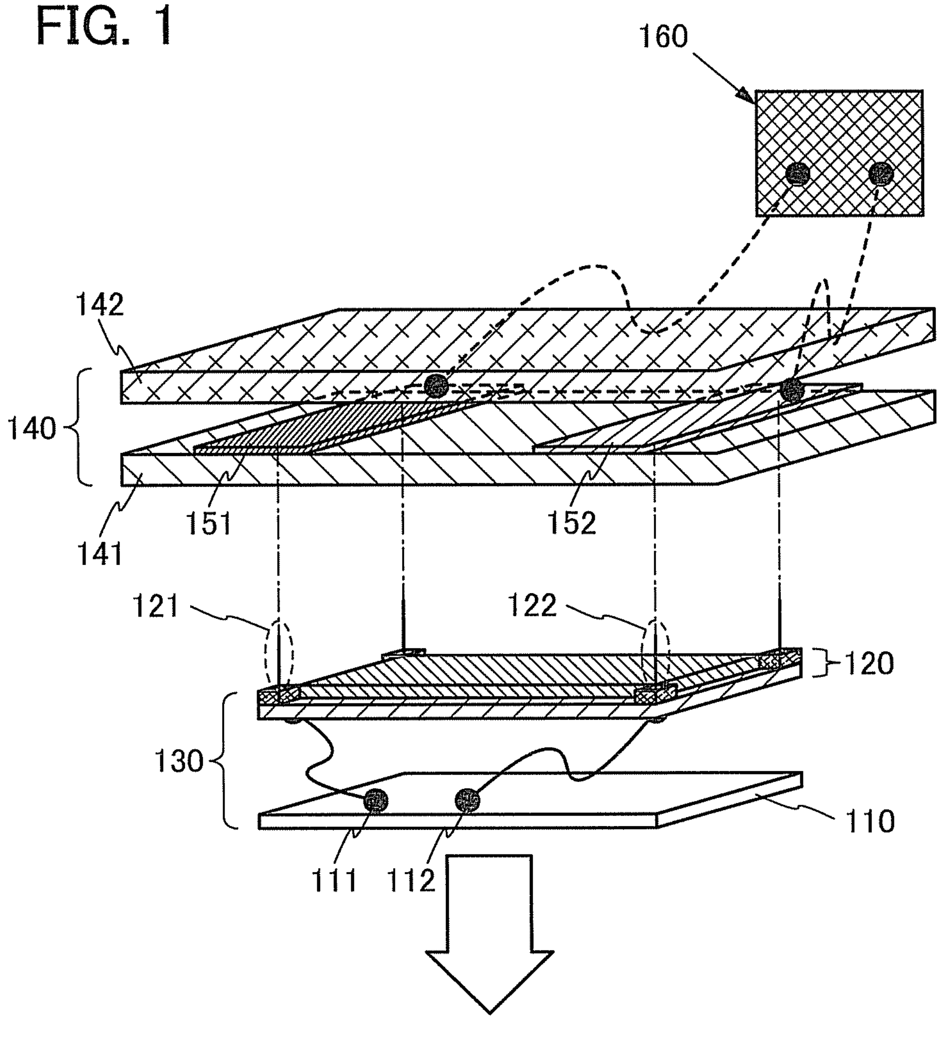
FIG. 1 illustrates a lighting device and an attachment board according to an embodiment.

Embodiments will be described in detail with reference to the drawings. Note that the present invention is not limited to the following description, and it will be easily understood by those skilled in the art that modes and details can be modified in various ways without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

Embodiment 1

In this embodiment, a lighting device and an attachment board of the lighting device will be described with reference to FIG. 1. The lighting device employs such a structure in which an attachment terminal included in a housing to which a lightweight planar light-emitting element is fixed is inserted into the attachment board, so as to fix the housing, and power is supplied from a wiring provided inside the attachment board to the light-emitting element through the attachment terminal.

FIG. 1 illustrates a lighting device 130 and an attachment board 140 of the lighting device 130, which are described as examples in this embodiment.

The lighting device 130 includes a light-emitting element 110 and a housing 120. The light-emitting element 110 includes a layer containing a light-emitting organic compound between a first electrode which is spread out in a plane and a second electrode which is spread out in a plane. The light-emitting element 110 includes a first extraction terminal 111 and a second extraction terminal 112, which are respectively connected to the first electrode and the second electrode. As the light-emitting element 110, an organic electroluminescent element (also referred to as an organic EL element) can be used, for example.

The housing 120 supports the light-emitting element 110. The housing 120 includes a first attachment terminal 121 and a second attachment terminal 122 which are apart from each other. The first attachment terminal 121 is electrically connected to the first extraction terminal 111, and the second attachment terminal 122 is electrically connected to the second extraction terminal 112. The shape of the attachment terminal is preferably, but not limited to, a nail-like shape (a pin-like shape) or a plate-like shape. With a nail-like shape or a plate-like shape, the attachment terminal can be easily inserted into the attachment board and is unlikely to be detached therefrom owing to friction between the attachment terminal and the attachment board. Specifically, the surface area of the attachment terminal is preferably 0.5 times or more as large as the cross-sectional area thereof, in which case detachment is unlikely to occur, and is preferably 6 times or less as large as the cross-sectional area thereof, in which case the attachment terminal can be easily inserted into the attachment board. Note that the surface area of the attachment terminal designates an area of a portion of the attachment terminal which is in contact with the attachment board and the cross-section area designates an area of a portion of the attachment terminal which is cut perpendicular to the inserting direction of the attachment terminal into the attachment board.

Note that the housing 120 may be provided with an attachment terminal which is not electrically connected to the light-emitting element 110, in addition to the first attachment terminal 121 and the second attachment terminal 122. With such a structure, the lighting device 130 can be fixed to the attachment board 140 more surely.

The attachment board 140 of the lighting device 130 includes a first member 141 which is spread out in a plane and a second member 142 which is spread out in a plane. An area of the lighting device is not limited, for example, the lighting device with an area of 0.1 $cm^2$ or more, less than 100 $cm^2$, preferably 100 $cm^2$ or more may be used. The first member 141 has elasticity, and includes a region in which friction between the first member 141 and the attachment terminal in the thickness direction is large. At the positions where the first attachment terminal 121 and the second attachment terminal 122 are inserted, inserting holes may be provided in advance, or inserting holes may be formed by insertion of the first attachment terminal 121 and the second attachment terminal 122. As examples of a material which can be used for the first member 141, a gypsum board, a urethane foam board, and the like can be given.

Between the first member 141 and the second member 142, a first wiring 151 and a second wiring 152 parallel to each other and extending long in one direction are provided. As a material of each of the first wiring 151 and the second wiring 152, a tape-shaped metal foil having conductivity (specifically, a copper foil), a fiber metal weaved into a mesh, or a fiber metal molded into a nonwoven fabric can be used. The first wiring 151 and the second wiring 152 are placed so that the distance therebetween is the same as that between the first attachment terminal 121 and the second attachment terminal 122. With such a structure, the first attachment terminal 121 inserted into the first member 141 penetrates the first member 141 to be electrically connected to the first wiring 151, and the second attachment terminal 122 inserted into the first member 141 penetrates the first member 141 to be electrically connected to the second wiring 152. In addition, since the first wiring 151 and the second wiring 152 extend long in one direction, the position of the lighting device 130 can be easily changed along the long extended direction.

Note that a power source 160 supplies power to the first wiring 151 and the second wiring 152. Thus, the power source 160 supplies power from the first wiring 151 and the second wiring 152 to the first electrode which is spread out in a plane and the second electrode which is spread out in a plane of the light-emitting element 110 through the first attachment terminal 121, the second attachment terminal 122, the first extraction terminal 111, and the second extraction terminal 112.

A plurality of lighting devices can be attached to the attachment board 140. The plurality of lighting devices attached between the first wiring 151 and the second wiring 152 are connected in parallel to the power source 160. In the case of using an organic EL element as the light-emitting element 110 for example, it is difficult to drive the lighting devices connected in parallel at the same brightness. This is because the brightness of an organic EL element is significantly changed by a slight change in driving voltage. Thus, a structure may be employed in which the housing 120 is provided with a constant current circuit and power received by the first attachment terminal and the second attachment terminal is converted into constant current by the constant current circuit to be supplied to the light-emitting element 110. With such a structure, the plurality of lighting devices connected in parallel to the power source 160 can emit light at the same brightness.

The width of the first wiring 151 (the width refers to the length in the short direction which is perpendicular to the long extended direction) is larger than the width (i.e., the length in the short direction of the first wiring 151) of the first attachment terminal 121, and the width of the second wiring 152 (the width refers to the length in the short direction which is perpendicular to the long extended direction) is larger than the width (i.e., the length in the short direction of the second wiring 152) of the second attachment terminal 122. Such a structure can prevent a problem such that the attachment terminal cuts the wiring.

Described, as examples, in this embodiment are the lighting device and the attachment board of the lighting device. The lighting device employs the structure in which an attachment terminal included in a housing to which a lightweight planar light-emitting element is fixed is inserted into the attachment board, so as to fix the housing, and power is supplied from a wiring provided inside the attachment board through the attachment terminal. With such a structure, a lighting device whose attachment position can be easily changed and an attachment board of the lighting device can be provided without subjecting the attachment board to processing which impairs the appearance.

Note that this embodiment can be combined with any of the other embodiments in this specification as appropriate.

Embodiment 2

In this embodiment, lighting devices and an attachment board of the lighting device will be described with reference to FIGS. 2A and 2B. Each lighting device employs such a structure in which an attachment terminal included in a housing to which a lightweight planar light-emitting element is fixed is inserted into the attachment board, so as to fix the housing, and power is supplied from a wiring included in the attachment board to the light-emitting element through the attachment terminal.

Figure 2A:
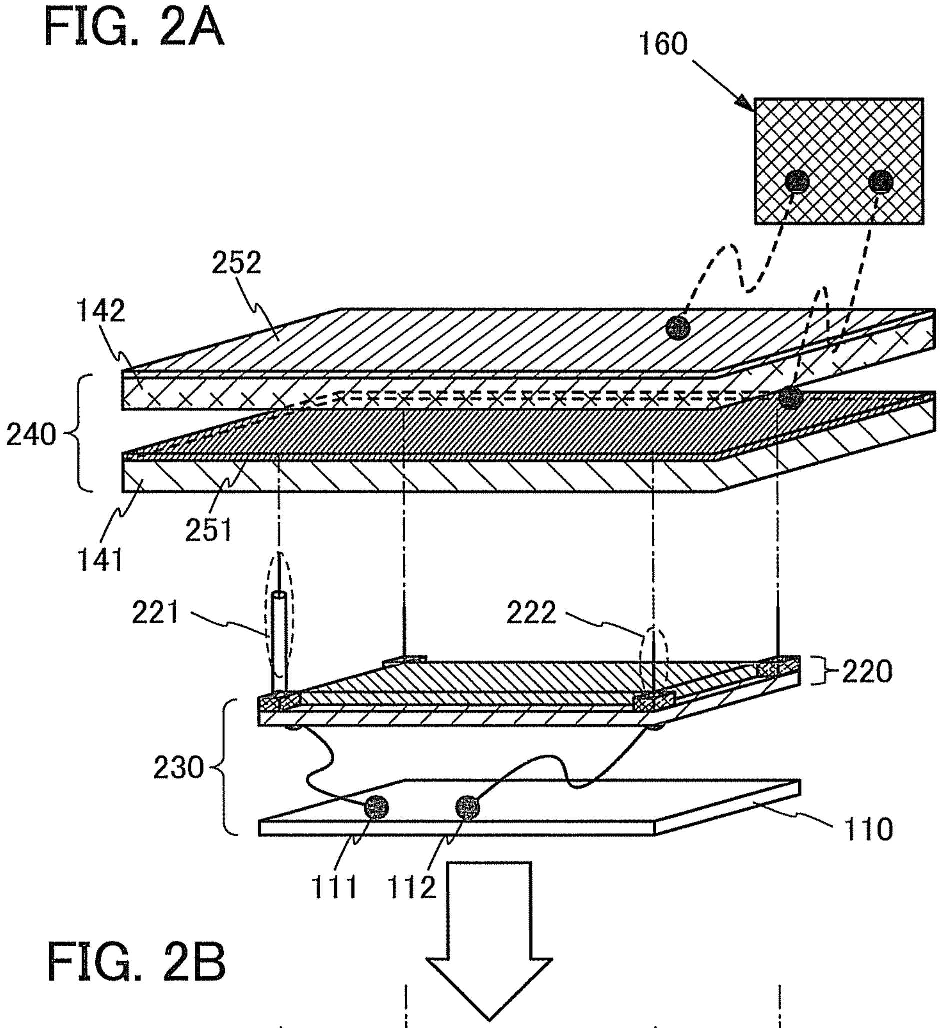
FIGS. 2A and 2B illustrate lighting devices and an attachment board according to an embodiment.
Figure 2B:
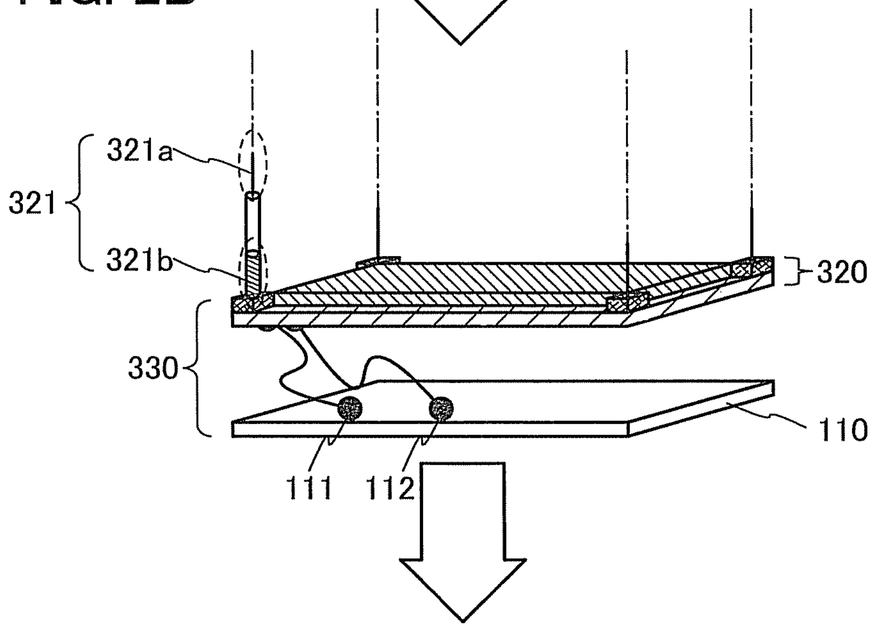

FIG. 2A illustrates a lighting device 230 and an attachment board 240 of the lighting device 230, which are described as examples in this embodiment.

The lighting device 230 includes a light-emitting element 110 and a housing 220. As the light-emitting element 110, a light-emitting element similar to that described in Embodiment 1 can be used.

The housing 220 supports the light-emitting element 110. The housing 220 includes a first attachment terminal 221 and a second attachment terminal 222 which are apart from each other. The first attachment terminal 221 is electrically connected to the first extraction terminal 111, and the second attachment terminal 222 is electrically connected to the second extraction terminal 112. The first attachment terminal 221 is longer than the second attachment terminal 222, and has a contact at a portion farther from the housing than a portion of a contact of the second attachment terminal 222. Note that a portion of the first attachment terminal 221 on the housing side, specifically, a portion within a length equal to the length of the second attachment terminal 222 from the housing, needs to be insulated. As a method for covering the portion of the first attachment terminal 221 on the housing side with an insulator, for example, an insulating resin, such as tetrafluoroethylene, or paint may be applied thereto. The attachment terminal preferably has a nail-like shape or a plate-like shape. With a nail-like shape or a plate-like shape, the attachment terminal can be easily inserted into the attachment board and is unlikely to be detached therefrom owing to friction between the attachment terminal and the attachment board. Specifically, the surface area of the attachment terminal is preferably 0.5 times or more as large as the cross-sectional area thereof, in which case detachment is unlikely to occur, and is preferably 6 times or less as large as the cross-sectional area thereof, in which case the attachment terminal can be easily inserted into the attachment board.

Note that the housing 220 may be provided with an attachment terminal which is not electrically connected to the light-emitting element 110, in addition to the first attachment terminal 221 and the second attachment terminal 222. With such a structure, the lighting device 230 can be fixed to the attachment board 240 more surely.

The attachment board 240 of the lighting device 230 includes a first member 141 which is spread out in a plane and a second member 142 which is spread out in a plane. As the first member 141, a member similar to the first member 141 described in Embodiment 1 can be used. Note that in this embodiment, the second member 142 is also a member similar to the first member 141 described in Embodiment 1.

Between the first member 141 and the second member 142, a first wiring 251 is provided. Further, a second wiring 252 is provided on a surface of the second member 142 on the side opposite to the side facing the first member 141. With such a structure, the second attachment terminal 222 inserted into the first member 141 can be electrically connected to the first wiring 251, and the first attachment terminal 221 inserted into the first member 141 and the second member 142 can be electrically connected to the second wiring 252. In addition, the first wiring 251 and the second wiring 252 are each spread out in a plane, so that the position of the lighting device 230 can be freely changed within a region in which the wirings are provided.

Note that the power source 160 supplies power to the first wiring 251 and the second wiring 252. Thus, the power source 160 supplies power from the first wiring 251 and the second wiring 252 to the first electrode which is spread out in a plane and the second electrode which is spread out in a plane of the light-emitting element 110 through the first attachment terminal 221, the second attachment terminal 222, the first extraction terminal 111, and the second extraction terminal 112.

FIG. 2A illustrates the state where the first attachment terminal 221 and the second attachment terminal 222 are provided apart from each other; however, this embodiment is not limited thereto.

A modification example of this embodiment will be described with reference to FIG. 2B. A lighting device 330 illustrated as an example in FIG. 2B includes a light-emitting element 110 and a housing 320. As the light-emitting element 110, a light-emitting element similar to that described in Embodiment 1 can be used.

The housing 320 supports the light-emitting element 110. The housing 320 includes an attachment terminal 321. The attachment terminal 321 has a first contact 321*a* at the end and a second contact 321*b* on the housing side. The first contact 321*a* is electrically connected to the first extraction terminal 111, and the second contact 321*b* is electrically connected to the second extraction terminal 112. The attachment terminal preferably has a nail-like shape or a plate-like shape. With a nail-like shape or a plate-like shape, the attachment terminal can be easily inserted into the attachment board and is unlikely to be detached therefrom owing to friction between the attachment terminal and the attachment board. Specifically, the surface area of the attachment terminal is preferably 0.5 times or more as large as the cross-sectional area thereof, in which case detachment is unlikely to occur, and is preferably 6 times or less as large as the cross-sectional area thereof, in which case the attachment terminal can be easily inserted into the attachment board.

Note that the housing 320 may be provided with an attachment terminal which is not electrically connected to the light-emitting element 110, in addition to the attachment terminal 321. With such a structure, the lighting device 330 can be fixed to the attachment board 240 more surely.

Between the first member 141 and the second member 142, the first wiring 251 is provided. Further, the second wiring 252 is provided on a surface of the second member 142 on the side opposite to the side facing the first member 141. With such a structure, the second contact 321*b* of the attachment terminal 321 inserted into the first member 141 can be electrically connected to the first wiring 251, and the first contact 321*a* of the attachment terminal 321 inserted into the first member 141 and the second member 142 can be electrically connected to the second wiring 252. In addition, the first wiring 251 and the second wiring 252 are each spread out in a plane, so that the position of the lighting device 330 can be freely changed within a region in which the wirings are provided.

Described, as examples, in this embodiment are the lighting devices and the attachment board of the lighting device. Each lighting device employs the structure in which an attachment terminal included in a housing to which a lightweight planar light-emitting element is fixed is inserted into the attachment board, so as to fix the housing, and power is received from a wiring included in the attachment board through the attachment terminal. With such a structure, a lighting device whose attachment position can be easily changed to a position desired by a user and an attachment board of the lighting device can be provided without subjecting the attachment board to processing which impairs the appearance.

Note that this embodiment can be combined with any of the other embodiments in this specification as appropriate.

Embodiment 3

In this embodiment, an example of a structure of a light-emitting element which can be applied to a lighting device will be described with reference to FIGS. 3A to 3C and FIGS. 4A and 4B. The lighting device employs such a structure in which an attachment terminal included in a housing to which a lightweight planar light-emitting element is fixed is inserted into an attachment board, so as to fix the housing, and power is supplied from a wiring provided inside the attachment board to the light-emitting element through the attachment terminal.

A light-emitting element described as an example in this embodiment includes a first electrode, a second electrode, and a layer containing a light-emitting organic compound (hereinafter referred to as an EL layer) between the first electrode and the second electrode. In this embodiment, the first electrode which is formed over a substrate serves as an anode and the second electrode serves as a cathode. The EL layer is provided between the first electrode and the second electrode, and a structure of the EL layer may be appropriately selected in accordance with materials of the first electrode and second electrode. An example of a structure of the light-emitting element will be described below; it is needless to say that the structure of the light-emitting element is not limited to this example.

<Structure Example 1 of Light-Emitting Element>

Figure 3A:
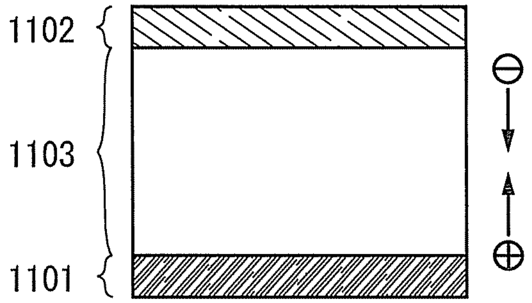
FIGS. 3A to 3C each illustrate a light-emitting element according to an embodiment.

An example of a structure of a light-emitting element is illustrated in FIG. 3A. In the light-emitting element illustrated in FIG. 3A, an EL layer 1103 is interposed between an anode 1101 and a cathode 1102.

When voltage higher than threshold voltage is applied between the anode 1101 and the cathode 1102, holes are injected to the EL layer 1103 from the anode 1101 side and electrons are injected to the EL layer 1103 from the cathode

1102 side. The injected electrons and holes are recombined in the EL layer 1103 and the light-emitting substance contained in the EL layer 1103 emits light.

The EL layer 1103 may include at least a light-emitting layer containing a light-emitting substance, and may have a structure in which a layer other than the light-emitting layer and the light-emitting layer are stacked. Examples of the layer other than the light-emitting layer are layers containing a substance having a high hole-injection property, a substance having a high hole-transport property, a substance having a poor hole-transport property (a substance which blocks holes), a substance having a high electron-transport property, a substance having a high electron-injection property, and a substance having a bipolar property (a substance having high electron-and-hole-transport properties).

Figure 3B:
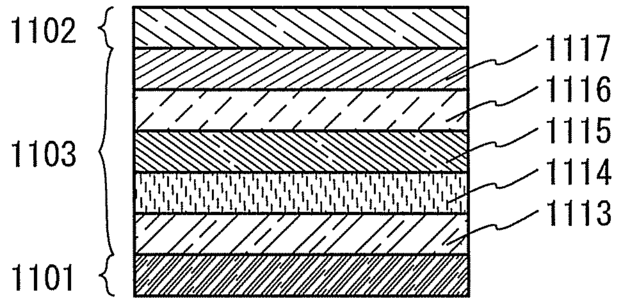

An example of a specific structure of the EL layer 1103 is illustrated in FIG. 3B. The EL layer 1103 illustrated in FIG. 3B has a structure in which a hole-injection layer 1113, a hole-transport layer 1114, a light-emitting layer 1115, an electron-transport layer 1116, and an electron-injection layer 1117 are stacked from the anode 1101 side.

<Structure Example 2 of Light-Emitting Element>

Figure 3C:
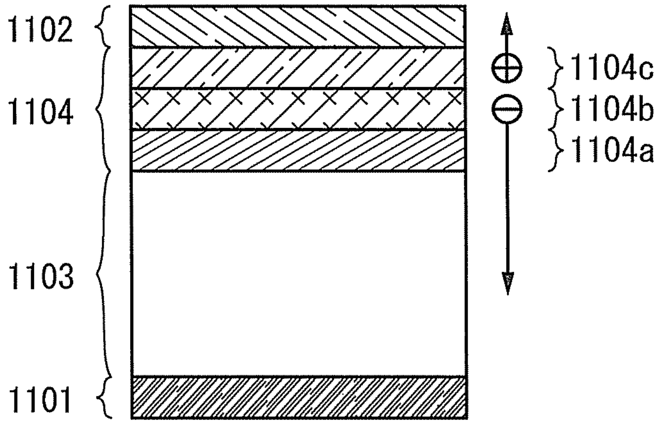

Another example of a structure of a light-emitting element is illustrated in FIG. 3C. In a light-emitting element which is illustrated as an example in FIG. 3C, the EL layer 1103 is interposed between the anode 1101 and the cathode 1102. Further, an intermediate layer 1104 is provided between the cathode 1102 and the EL layer 1103. Note that a structure similar to that in the above structure example 1 of the light-emitting element can be applied to the EL layer 1103 in the structure example 2 of the light-emitting element, and for the details, the description of the structure example 1 of the light-emitting element can be referred to.

The intermediate layer 1104 may be formed to include at least a charge generation region, and may have a structure in which the charge generation region and a layer other than the charge generation region are stacked. For example, a structure can be employed in which a first charge generation region 1104*c*, an electron-relay layer 1104*b*, and an electron-injection buffer 1104*a* are stacked in that order from the cathode 1102 side.

The behaviors of electrons and holes in the intermediate layer 1104 are described. When voltage higher than threshold voltage is applied between the anode 1101 and the cathode 1102, in the first charge generation region 1104*c*, holes and electrons are generated, and the holes move into the cathode 1102 and the electrons move into the electron-relay layer 1104*b*. The electron-relay layer 1104*b* has a high electron-transport property and immediately transfers the electrons generated in the first charge generation region 1104*c* to the electron-injection buffer 1104*a*. The electron-injection buffer 1104*a* can reduce a barrier in injection of electrons into the EL layer 1103, and the efficiency of the electron injection into the EL layer 1103 can be improved. Thus, the electrons generated in the first charge generation region 1104*c* are injected into the LUMO level of the EL layer 1103 through the electron-relay layer 1104*b* and the electron-injection buffer 1104*a*.

In addition, the electron-relay layer 1104*b* can prevent interaction in which the substance included in the first charge generation region 1104*c* and the substance included in the electron-injection buffer 1104*a* react with each other at the interface thereof and the functions of the first charge generation region 1104*c* and the electron-injection buffer 1104*a* are damaged.

<Structure Example 3 of Light-Emitting Element>

Figure 4A:
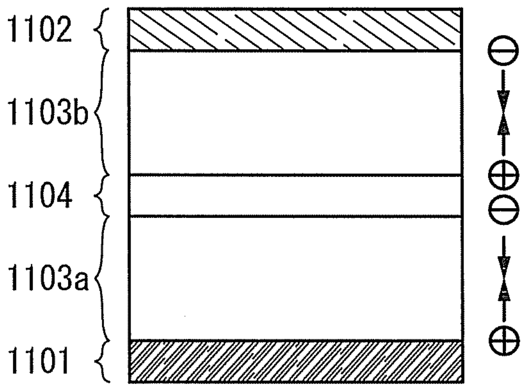
FIGS. 4A and 4B each illustrate a light-emitting element according to an embodiment.
Figure 4B:
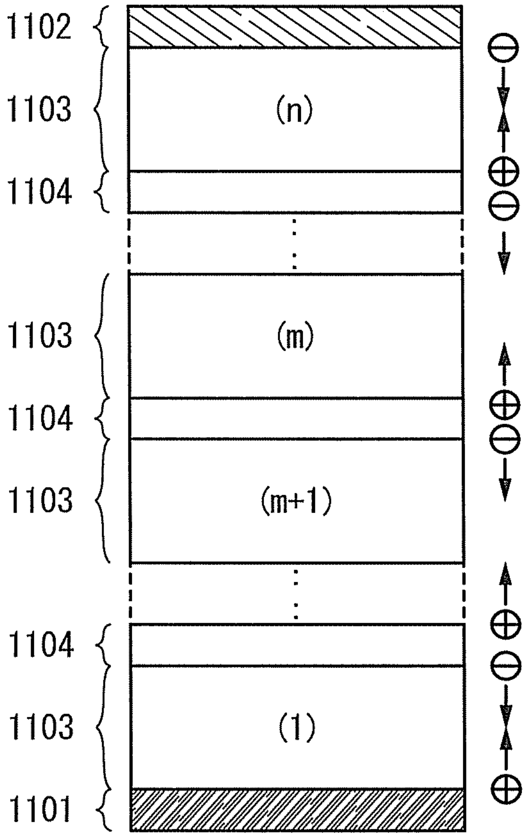

Another example of a structure of a light-emitting element is illustrated in FIG. 4A. In a light-emitting element which is illustrated as an example in FIG. 4A, an EL layer 1103*a* and an EL layer 1103*b* are provided between the anode 1101 and the cathode 1102. Further, the intermediate layer 1104 is provided between the EL layer 1103*a* and the EL layer 1103*b*.

Note that the number of the EL layers provided between the anode and the cathode is not limited to two. A light-emitting element which is illustrated as an example in FIG. 4B has a structure in which a plurality of EL layers 1103 are stacked, that is, a stacked-layer element structure. Note that in the case where n (n is a natural number of 2 or more) EL layers 1103 are provided between the anode and the cathode, the intermediate layer 1104 is provided between an m-th (m is a natural number greater than or equal to 1 and less than or equal to n−1) EL layer and an (m+1)-th EL layer.

Note that a structure similar to that in the above structure example 1 of the light-emitting element can be applied to the EL layers 1103*a* and 1103*b* in the structure example 3 of the light-emitting element; a structure similar to that in the above structure example 2 of the light-emitting element can be applied to the intermediate layer 1104 in the structure example 3 of the light-emitting element. Thus, for the details, the description of the structure example 1 of the light-emitting element or the structure example 2 of the light-emitting element can be referred to.

The behaviors of electrons and holes in the intermediate layer 1104 provided between the EL layers are described. When voltage higher than threshold voltage is applied between the anode 1101 and the cathode 1102, in the intermediate layer 1104, holes and electrons are generated, and the holes move into the EL layer which is provided on the cathode 1102 side and the electrons move into the EL layer which is provided on the anode 1101 side. The holes injected into the EL layer which is provided on the cathode side are recombined with the electrons injected from the cathode side, so that the light-emitting substance contained in the EL layer emits light. The electrons injected into the EL layer which is provided on the anode side are recombined with the holes injected from the anode side, so that the light-emitting substance contained in the EL layer emits light. Thus, the holes and electrons generated in the intermediate layer 1104 cause light emission in the respective EL layers.

Note that in the case where a structure which is the same as an intermediate layer is formed between the EL layers by providing the EL layers that are in contact with each other, the EL layers can be formed to be in contact with each other. Specifically, when a charge generation region is formed on one surface of the EL layer, the charge generation region functions as a first charge generation region of an intermediate layer; thus, the EL layers can be formed to be in contact with each other.

The structure examples 1 to 3 of the light-emitting element can be implemented in combination. For example, an intermediate layer may be provided between the cathode and the EL layer in the structure example 3 of the light-emitting element.

Embodiment 4

In this embodiment, examples of a lighting device which is completed with the use of a light-emitting device that is one embodiment of the present invention and an attachment board of the lighting device will be described with reference to FIGS. 5A and 5B.

According to one embodiment of the present invention, a lighting device in which a light-emitting portion has a curved surface can be realized.

One embodiment of the present invention can also be applied to lighting in a car; for example, lighting can be easily mounted on a dashboard, a ceiling, or the like.

Figure 5A:
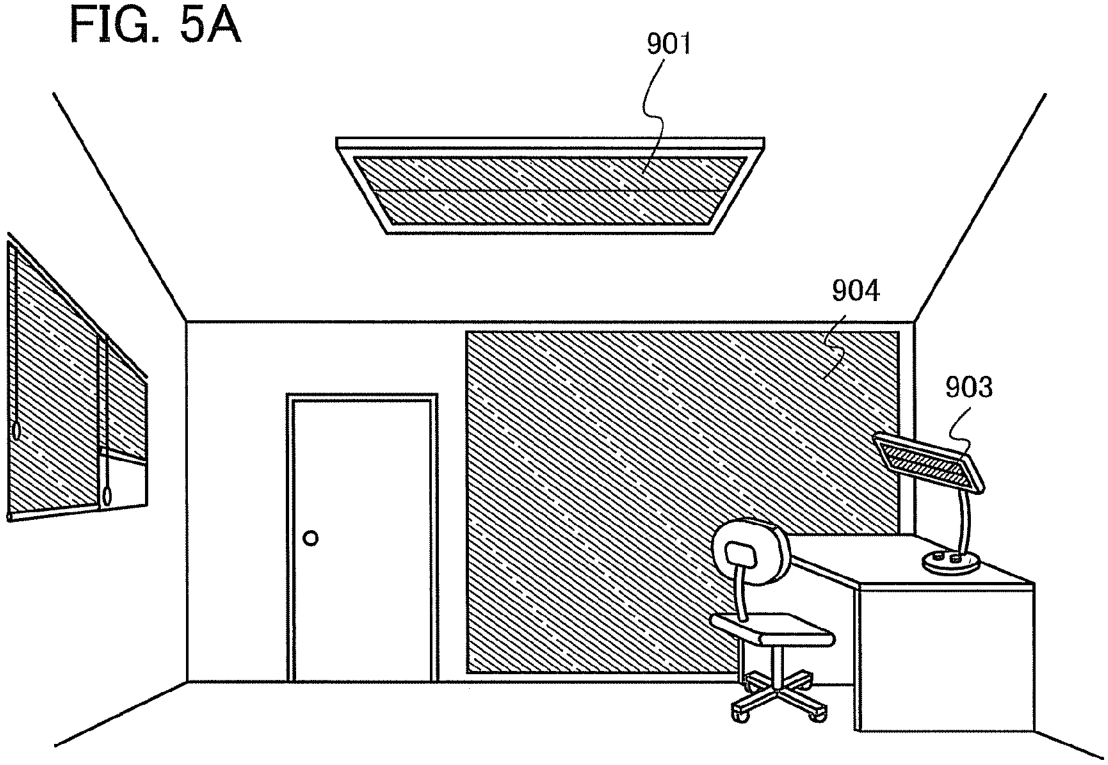
FIGS. 5A and 5B illustrate lighting devices and attachment boards according to an embodiment.

FIG. 5A illustrates a lighting device 901 mounted on an attachment board of the lighting device provided on a ceiling in a room, a lighting device 904 mounted on an attachment board of the lighting device provided on a wall, and a desk lamp 903 including an attachment board of the lighting device, to which one embodiment of the present invention is applied. Since the light-emitting device can have a larger area, it can be used as a lighting device having a large area.

Figure 5B:
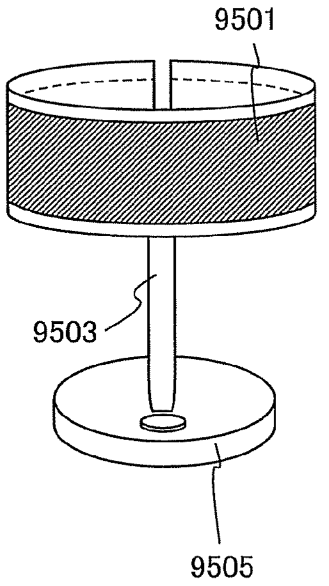

FIG. 5B illustrates an example of another lighting device. A desk lamp illustrated in FIG. 5B includes a lighting portion 9501, a support 9503, a support base 9505, and the like. The lighting portion 9501 includes an attachment board of the lighting device and a light-emitting device according to one embodiment of the present invention. According to one embodiment of the present invention, a lighting device having a curved surface can be realized.

This embodiment can be freely combined with any of the other embodiments.

This application is based on Japanese Patent Application serial no. 2011-012067 filed with Japan Patent Office on Jan. 24, 2011, the entire contents of which are hereby incorporated by reference.

What is claimed is:

1. A lighting device comprising:

a light-emitting element comprising a layer containing a light-emitting organic compound between a first electrode and a second electrode; and a housing comprising a first attachment terminal and a second attachment terminal at a distance between the first attachment terminal and the second attachment terminal on one side of the housing, the first attachment terminal being electrically connected to the first electrode and the second attachment terminal being electrically connected to the second electrode, wherein at least one of the first electrode and the second electrode is capable of transmitting light emitted from the light-emitting organic compound, and wherein the light-emitting element is positioned on the other side of the housing.

2. A lighting device according to claim 1, wherein each of the first attachment terminal and the second attachment terminal has a surface area greater than or equal to 0.5 times and less than or equal to 6 times as large as a cross-sectional area.

3. A lighting device according to claim 1, wherein each of the first attachment terminal and the second attachment terminal has a pin-like shape or a plate-like shape.

4. A lighting device according to claim 1, wherein the first attachment terminal and the second attachment terminal are capable of being electrically connected to a first wiring and a second wiring provided in an attachment board.

5. An attachment board comprising:

a first wiring and a second wiring over a first member; and a second member over the first wiring and the second wiring, wherein the first wiring and the second wiring are positioned at a distance between the first wiring and the second wiring, and wherein the first wiring and the second wiring have different polarities.

6. An attachment board according to claim 5, wherein the first wiring and the second wiring comprise a fiber metal weaved into a mesh, or a fiber metal molded into a nonwoven fabric.

7. An attachment board according to claim 5, wherein the first wiring and the second wiring are capable of being electrically connected to a first attachment terminal and a second attachment terminal provided in a lighting device.

8. An attachment board according to claim 7, wherein the first wiring has a larger width than a width of the first attachment terminal, wherein the second wiring has a larger width than a width of the second attachment terminal, and wherein the first member has a thickness smaller than each of a length of the first attachment terminal and a length of the second attachment terminal.

9. A lighting apparatus comprising:

a lighting device comprising:

a light-emitting element comprising a layer containing a light-emitting organic compound between a first electrode and a second electrode; and a housing comprising a first attachment terminal and a second attachment terminal at a distance between the first attachment terminal and the second attachment terminal on one side of the housing, the first attachment terminal being electrically connected to the first electrode and the second attachment terminal being electrically connected to the second electrode, wherein at least one of the first electrode and the second electrode is capable of transmitting light emitted from the light-emitting organic compound, and wherein the light-emitting element is positioned on the other side of the housing, an attachment board comprising:

a first wiring and a second wiring over a first member; and a second member over the first wiring and the second wiring, wherein the first wiring and the second wiring are positioned at the distance between the first wiring and the second wiring, wherein the first wiring and the second wiring have different polarities, and wherein the first attachment terminal and the second attachment terminal penetrate the first member so as to electrically connect to the first wiring and the second wiring.

10. A lighting apparatus according to claim 9, wherein each of the first attachment terminal and the second attachment terminal has a surface area greater than or equal to 0.5 times and less than or equal to 6 times as large as a cross-sectional area.

11. A lighting apparatus according to claim 9, wherein each of the first attachment terminal and the second attachment terminal has a pin-like shape or a plate-like shape.

12. A lighting apparatus according to claim 9, wherein the first wiring and the second wiring comprise a fiber metal weaved into a mesh, or a fiber metal molded into a nonwoven fabric.

13. A lighting apparatus according to claim 9, wherein the first wiring has a larger width than a width of the first attachment terminal, wherein the second wiring has a larger width than a width of the second attachment terminal, and wherein the first member has a thickness smaller than each of a length of the first attachment terminal and a length of the second attachment terminal.

14. A lighting device comprising:

a light-emitting element comprising a layer containing a light-emitting organic compound between a first electrode and a second electrode; and a housing comprising a first attachment terminal and a second attachment terminal at a distance between the first attachment terminal and the second attachment terminal on one side of the housing, the first attachment terminal being electrically connected to the first electrode and the second attachment terminal being electrically connected to the second electrode, wherein at least one of the first electrode and the second electrode is capable of transmitting light emitted from the light-emitting organic compound, wherein the light-emitting element is positioned on the other side of the housing, and wherein one of the first attachment terminal and the second attachment terminal is longer than the other.

15. A lighting device comprising according to claim 14, wherein each of the first attachment terminal and the second attachment terminal has a surface area greater than or equal to 0.5 times and less than or equal to 6 times as large as a cross-sectional area.

16. A lighting device comprising according to claim 14, wherein each of the first attachment terminal and the second attachment terminal has a pin-like shape or a plate-like shape.

17. A lighting device according to claim 14, wherein the first attachment terminal and the second attachment terminal are capable of being electrically connected to a first wiring and a second wiring provided in an attachment board.

18. An attachment board comprising:

a first wiring over a first member;

a second member over the first wiring; and a second wiring over the second member, wherein the first wiring and the second wiring have different polarities.

19. An attachment board according to claim 18, wherein the first wiring and the second wiring comprise a fiber metal weaved into a mesh, or a fiber metal molded into a nonwoven fabric.

20. An attachment board according to claim 18, wherein the first wiring and the second wiring are capable of being electrically connected to a first attachment terminal and a second attachment terminal provided in a lighting device.

21. An attachment board according to claim 20, wherein the first member has a thickness smaller than each of a length of the first attachment terminal and a length of the second attachment terminal, and wherein a thickness of a stack of the first member, the first wiring, and the second member is larger than a length of one of the first attachment terminal and the second attachment terminal and smaller than a length of the other.

22. A lighting apparatus comprising:

a lighting device comprising:

a light-emitting element comprising a layer containing a light-emitting organic compound between a first electrode and a second electrode; and a housing comprising a first attachment terminal and a second attachment terminal at a distance between the first attachment terminal and the second attachment terminal on one side of the housing, the first attachment terminal being electrically connected to the first electrode and the second attachment terminal being electrically connected to the second electrode, wherein at least one of the first electrode and the second electrode is capable of transmitting light emitted from the light-emitting organic compound, wherein the light-emitting element is positioned on the other side of the housing, and wherein one of the first attachment terminal and the second attachment terminal is longer than the other, an attachment board comprising:

a first wiring over a first member;

a second member over the first wiring; and a second wiring over the second member, wherein the first wiring and the second wiring have different polarities, wherein the first attachment terminal and the second attachment terminal penetrate the first member so as to electrically connect to the first wiring and the second wiring.

23. A lighting apparatus according to claim 22, wherein each of the first attachment terminal and the second attachment terminal has a surface area greater than or equal to 0.5 times and less than or equal to 6 times as large as a cross-sectional area.

24. A lighting apparatus according to claim 22, wherein each of the first attachment terminal and the second attachment terminal has a pin-like shape or a plate-like shape.

25. A lighting apparatus according to claim 22, wherein the first wiring and the second wiring comprise a fiber metal weaved into a mesh, or a fiber metal molded into a nonwoven fabric.

26. A lighting apparatus according to claim 22, wherein the first member has a thickness smaller than each of a length of the first attachment terminal and a length of the second attachment terminal, and wherein a thickness of a stack of the first member, the first wiring, and the second member is larger than a length of one of the first attachment terminal and the second attachment terminal and smaller than a length of the other.

27. A lighting device comprising:

a light-emitting element comprising a layer containing a light-emitting organic compound between a first electrode and a second electrode; and a housing comprising an attachment terminal on one side of the housing, wherein at least one of the first electrode and the second electrode is capable of transmitting light emitted from the light-emitting organic compound, wherein the light-emitting element is positioned on the other side of the housing, and wherein the attachment terminal comprises on an end side a first contact electrically connected to the first electrode and comprises on a housing side a second contact electrically connected to the second electrode.

28. A lighting device comprising according to claim 27, wherein the attachment terminal has a surface area greater than or equal to 0.5 times and less than or equal to 6 times as large as a cross-sectional area.

29. A lighting device comprising according to claim 27, wherein the attachment terminal has a pin-like shape or a plate-like shape.

30. A lighting device according to claim 27, wherein the first contact and the second contact are capable of being electrically connected to a first wiring and a second wiring provided in an attachment board.

31. An attachment board according to claim 18, wherein the first wiring and the second wiring are capable of being electrically connected to a second contact and a first contact of an attachment terminal provided in a lighting device respectively.

32. An attachment board according to claim 31, wherein the first member has a thickness smaller than each of a length from a base of the attachment terminal to the first contact of the attachment terminal and a length from the base of the attachment terminal to the second contact of the attachment terminal, and wherein a thickness of a stack of the first member, the first wiring, and the second member is larger than a length from the base of the attachment terminal to the second contact of the attachment terminal and smaller than a length from the base of the attachment terminal to the first contact of the attachment terminal.

33. A lighting apparatus comprising:

a lighting device comprising:

a light-emitting element comprising a layer containing a light-emitting organic compound between a first electrode and a second electrode; and a housing comprising a attachment terminal on one side of the housing, wherein at least one of the first electrode and the second electrode is capable of transmitting light emitted from the light-emitting organic compound, wherein the light-emitting element is positioned on the other side of the housing, and wherein the attachment terminal comprises on an end side a first contact electrically connected to the first electrode and comprises on a housing side a second contact electrically connected to the second electrode, an attachment board comprising:

a first wiring over a first member;

a second member over the first wiring; and a second wiring over the second member, wherein the first wiring and the second wiring have different polarities, wherein the attachment terminal penetrates the first member and the second member so that the first contact and the second contact of the attachment terminal are electrically connected to the second wiring and the first wiring respectively.

34. A lighting apparatus according to claim 33, wherein the attachment terminal has a surface area greater than or equal to 0.5 times and less than or equal to 6 times as large as a cross-sectional area.

35. A lighting apparatus according to claim 33, wherein the attachment terminal has a pin-like shape or a plate-like shape.

36. A lighting apparatus according to claim 33, wherein the first wiring and the second wiring comprise a fiber metal weaved into a mesh, or a fiber metal molded into a nonwoven fabric.

37. A lighting apparatus according to claim 33, wherein the first member has a thickness smaller than each of a length from the housing to the first contact of the attachment terminal and a length from the housing to the second contact of the attachment terminal, and wherein a thickness of a stack of the first member, the first wiring, and the second member is larger than a length from the housing to the second contact of the attachment terminal and smaller than a length from the housing to the first contact of the attachment terminal.

* * * * *